United States Patent
Deng

(10) Patent No.: US 10,634,958 B1
(45) Date of Patent: Apr. 28, 2020

(54) MANUFACTURING METHOD OF BLACK PHOTO SPACER ARRAY SUBSTRATE AND BLACK PHOTO SPACER ARRAY SUBSTRATE

(71) Applicant: SHENZHEN CHINA STAR OPTOELECTRONICS TECHNOLOGY CO., LTD., Shenzhen, Guangdong (CN)

(72) Inventor: Zhuming Deng, Guangdong (CN)

(73) Assignee: SHENZHEN CHINA STAR OPTOELECTRONICS TECHNOLOGY CO., LTD., Shenzhen, Guangdong (CN)

( * ) Notice: Subject to any disclaimer, the term of this patent is extended or adjusted under 35 U.S.C. 154(b) by 105 days.

(21) Appl. No.: 16/088,401

(22) PCT Filed: Sep. 7, 2018

(86) PCT No.: PCT/CN2018/104504
§ 371 (c)(1),
(2) Date: Sep. 25, 2018

(87) PCT Pub. No.: WO2019/200819
PCT Pub. Date: Oct. 24, 2019

(30) Foreign Application Priority Data

Apr. 17, 2018 (CN) .......................... 2018 1 0344493

(51) Int. Cl.
*H01L 27/12* (2006.01)
*G02F 1/1339* (2006.01)
(Continued)

(52) U.S. Cl.
CPC .... *G02F 1/13394* (2013.01); *G02F 1/136209* (2013.01); *H01L 27/1244* (2013.01);
(Continued)

(58) Field of Classification Search
CPC ............. H01L 27/1244; H01L 27/1248; H01L 27/1259; G02F 1/13394; G02F 1/136209;
(Continued)

(56) References Cited

U.S. PATENT DOCUMENTS

| 6,654,075 B1 * | 11/2003 | Takeichi | ........... G02F 1/134336 349/43 |
| 10,345,660 B1 * | 7/2019 | Cao | .................... G02F 1/136209 |

(Continued)

FOREIGN PATENT DOCUMENTS

| CN | 103257482 A | 8/2013 |
| CN | 105974636 A | 9/2016 |

(Continued)

*Primary Examiner* — Earl N Taylor
(74) *Attorney, Agent, or Firm* — Leong C. Lei

(57) ABSTRACT

Provided is a manufacturing method of a black photo spacer array substrate. In a manufacturing method of a black photo spacer array substrate, a double layer color resist structure formed with a first color resist layer and a second color resist layer is used to pad a main pad part and a sub pad part of a main photo spacer and a sub photo spacer. Then, a thickness of the main photo spacer and a thickness of the sub photo spacer are decreased to reduce the usage amount of black photo spacer material of forming the main photo spacer and the sub photo spacer to reduce the production cost. A height difference of the main photo spacer and the sub photo spacer can be achieved by decreasing a thickness of the first color resist layer under the sub pad part with a half exposure process.

10 Claims, 5 Drawing Sheets

(51) Int. Cl.
*G02F 1/1362* (2006.01)
*G02F 1/1368* (2006.01)

(52) U.S. Cl.
CPC ...... *H01L 27/1248* (2013.01); *H01L 27/1259* (2013.01); *G02F 1/1368* (2013.01); *G02F 2001/13396* (2013.01); *G02F 2001/13398* (2013.01); *G02F 2001/136222* (2013.01)

(58) Field of Classification Search
CPC ......... G02F 1/1368; G02F 2001/13396; G02F 2001/13398; G02F 2001/136222
See application file for complete search history.

(56) References Cited

U.S. PATENT DOCUMENTS

| | | | |
|---|---|---|---|
| 10,503,034 B2* | 12/2019 | Ye | G02F 1/13439 |
| 2004/0095541 A1* | 5/2004 | Takeichi | G02F 1/134336 |
| | | | 349/139 |
| 2017/0192280 A1* | 7/2017 | Kwak | G02F 1/133345 |
| 2019/0219858 A1* | 7/2019 | Ye | G02F 1/13439 |

FOREIGN PATENT DOCUMENTS

| | | |
|---|---|---|
| CN | 107193162 A | 9/2017 |
| CN | 107479260 A | 12/2017 |

* cited by examiner

US 10,634,958 B1

MANUFACTURING METHOD OF BLACK PHOTO SPACER ARRAY SUBSTRATE AND BLACK PHOTO SPACER ARRAY SUBSTRATE

RELATED APPLICATIONS

The present application is a National Phase of International Application Number PCT/CN2018/104504, filed Sep. 7, 2018, and claims the priority of China Application No. 201810344493.9, filed Apr. 17, 2018.

FIELD OF THE INVENTION

The present invention relates to a display technology field, and more particularly to a manufacturing method of a black photo spacer array substrate and a black photo spacer array substrate.

BACKGROUND OF THE INVENTION

The Liquid Crystal Display (LCD) is the most widely used display product in the present market. The production technology is quite mature. The yield of the production is high. The production cost is relatively low and the acceptance is high in the market. Most of the liquid crystal displays on the present market are backlight type liquid crystal display devices, which comprise a liquid crystal display panel and a backlight module. Generally, the liquid crystal display panel comprises a color filter (CF) substrate, an array substrate, liquid crystal and a sealant sandwiched between the color filter substrate and the array substrate. The CF substrate mainly includes a color filter layer for forming colored lights with color resist units (R/G/B), a black matrix (BM) for preventing light leakage from the pixel edge, and photo spacers (PS) for maintaining a cell thickness. In a large scale liquid crystal display panel, more than two types of photo spacers are commonly used. As an illustration, a main photo spacer (Main PS) and a sub spacer (Sub PS) are provided on a CF substrate to play a role of multi-stage buffering for avoiding the occurrences of kinds of Muras or undesirable phenomena.

The black photo spacer (BPS) material is a new type of material that does not only have the characteristics of the spacer material of the prior art, such as superior elastic recovery force and lower pollution to the liquid crystal, but also possesses the properties of the black matrix material, such as a higher optical density (OD) value to provide a light shielding effect. Therefore, it can be used to combine the BM process and the PS process into one to reduce one photolithography process for reducing material cost and tact time, thereby reducing overall production cost.

The COA (Color Filter On Array) technology is to prepare the color filter layer on the array substrate. Since no alignment issue of the color filter substrate and the array substrate exists in the COA display panel, the difficulty of the cell process in the display panel manufacture process can be reduced to prevent the tolerance of the cell process. Accordingly, the black matrix can be designed to be narrow line width for promoting the aperture ratio of the pixel. A new BM-Less technology is a technology based on COA technology that combines BM and PS in the same BPS material and is completed in the same process and designed on the array substrate. Compared with the traditional liquid crystal display technology, the black matrix, the main photo spacer, the sub spacer and the color filter film are all designed on the array substrate side. The light leakage due to the shifting due to the assembly errors in the assembly process or due to the panel bending in the curved surface display. More importantly, one process and the material thereof can be eliminated to shorten the production time and to reduce the production cost.

However, the skill of BPS materials at present is relatively difficult, the mass production has not been achieved, and the price is expensive. In the existing BPS type product structure as shown in FIG. 1, the single layer of the first color resist 201 or the second color resist 202 below the main photo spacer 101 or the sub photo spacer 102 serves as a pad carrier. A height difference between the main photo spacer 101 and the sub photo spacer 102 is formed by a thickness difference between the first color resist 201 and the second color resist 202. The thickness hi of the main photo spacer 101 and the sub photo spacer 102 is similar to the cell gap H1 of the liquid crystal panel. The usage amount of the BPS material for the main photo spacer 101 and the sub photo spacer 102 is relatively large and the cost is high.

SUMMARY OF THE INVENTION

An objective of the present invention is to provide a manufacturing method of a black photo spacer array substrate, in which a thickness of a main photo spacer and a thickness of a sub photo spacer are smaller to reduce a usage amount of a black photo spacer material to reduce production cost.

Another objective of the present invention is to provide a black photo spacer array substrate, in which a thickness of a main photo spacer and a thickness of a sub photo spacer are smaller to reduce a usage amount of a black photo spacer material to reduce production cost.

For realizing the aforesaid objectives, the present invention provides a manufacturing method of a black photo spacer array substrate, comprising:

Step S1, providing a substrate, and forming a thin film transistor layer on the substrate, and forming a protective layer covering the thin film transistor layer on the substrate;

Step S2, forming a color resist layer on the protective layer, wherein the color resist layer includes a first color resist layer and a second color resist layer of different colors, and the first color resist layer includes a first pixel unit, a first main pad unit and a first sub pad unit, which are parallel with one another, and the second color resist layer includes a second pixel unit, a second main pad unit and a second sub pad unit, which are parallel with one another, wherein the first pixel unit and the second pixel unit are arranged side by side on the protective layer, and the first main pad unit and the second main pad unit are stacked on the protective layer together form a main pad part, and the first sub pad unit and the second sub pad unit are stacked on the protective layer together form a sub pad part, and the first color resist layer is formed by a half exposure process, and the first main pad unit and the first sub pad unit with different thicknesses are obtained with one exposure, so that a thickness of the first sub pad unit is smaller than a thickness of the first main pad unit, and then a height of the main pad part is greater than a height of the sub pad part;

Step S3, forming an organic insulating layer covering the color resist layer on the protective layer, and coating a black photo spacer material on the organic insulating layer and implementing exposure and development to the black photo spacer material to obtain a black photo spacer light shielding layer; wherein the black photo spacer light shielding layer includes a black matrix, and a main photo spacer and a sub photo spacer, which are both arranged on the black matrix, the main photo spacer and the sub photo spacer are correspondingly above the main pad part and the sub pad part, respectively, and a height of the main photo spacer is greater than a height of the sub photo spacer, and the height of the sub photo spacer is greater than a height of the black matrix.

In Step S2, a half tone mask or a gray tone mask is used to implement the half exposure process to prepare the first color resist layer to obtain the first main pad unit and the first sub pad unit with different thicknesses with one exposure;

In Step S3, a full exposure is used to expose the black photo spacer material to obtain the black matrix, the main photo spacer and a sub photo spacer, and a thickness difference between the first main pad unit and the first sub pad unit constitutes a height difference between the main pad part and the sub pad part.

In Step S2, the first main pad unit is correspondingly located on the second main pad unit, and the first sub pad unit is correspondingly located on the second sub pad unit; or, the second main pad unit is correspondingly located on the first main pad unit, and the second sub pad unit is correspondingly located on the first sub pad unit.

In Step S2, the color resist layer further includes a third color resist layer;

the third color resist layer includes a third pixel unit, which is arranged side by side with the first pixel unit and the second pixel unit on the protective layer;

the first color resist layer, the second color resist layer and the third color resist layer are one of a red color resist layer, a green color resist layer and a blue color resist layer, respectively.

In Step S1, the thin film transistor layer includes a scan line and a data line that is vertically crossed and insulated from the scan line;

the black matrix is correspondingly located above the scan line.

The present invention further provides a black photo spacer array substrate, comprising a substrate, a thin film transistor layer on the substrate, a protective layer covering the substrate and the thin film transistor layer, a color resist layer on the protective layer, an organic insulating layer covering the color resist layer and the protective layer and a black photo spacer light shielding layer on the organic insulating layer;

wherein the black photo spacer light shielding layer includes a black matrix; and a main photo spacer and a sub photo spacer, which are both arranged on the black matrix;

the color resist layer includes a first color resist layer and a second color resist layer of different colors, and the first color resist layer includes a first pixel unit; a first main pad unit and a first sub pad unit, which are parallel with one another; and the second color resist layer includes a second pixel unit, a second main pad unit and a second sub pad unit; which are parallel with one another, wherein the first pixel unit and the second pixel unit are arranged side by side on the protective layer, and the first main pad unit and the second main pad unit are stacked on the protective layer together form a main pad part, and the first sub pad unit and the second sub pad unit are stacked on the protective layer together form a sub pad part; and a thickness of the first sub pad unit is smaller than a thickness of the first main pad unit, and then a height of the main pad part is greater than a height of the sub pad part;

the main photo spacer and the sub photo spacer are correspondingly above the main pad part and the sub pad part, respectively, and a height of the main photo spacer is greater than a height of the sub photo spacer; and the height of the sub photo spacer is greater than a height of the black matrix.

A thickness difference between the first main pad unit and the first sub pad unit constitutes a height difference between the main pad part and the sub pad part.

The first main pad unit is correspondingly located on the second main pad unit, and the first sub pad unit is correspondingly located on the second sub pad unit; or, the second main pad unit is correspondingly located on the first main pad unit; and the second sub pad unit is correspondingly located on the first sub pad unit.

The color resist layer further includes a third color resist layer;

the third color resist layer includes a third pixel unit, which is arranged side by side with the first pixel unit and the second pixel unit on the protective layer;

the first color resist layer, the second color resist layer and the third color resist layer are one of a red color resist layer; a green color resist layer and a blue color resist layer, respectively.

The thin film transistor layer includes a scan line and a data line that is vertically crossed and insulated from the scan line;

the black matrix is correspondingly located above the scan line.

The benefits of the present invention are: in the manufacturing method of the black photo spacer array substrate provided by the present invention; a double layer color resist structure formed with the first color resist layer and the second color resist layer is used to pad the main pad part and the sub pad part of the main photo spacer and the sub photo spacer. Then, the main pad part and the sub pad part are convex, and the thickness of the main photo spacer and the thickness of the sub photo spacer are decreased to reduce the usage amount of black photo spacer material of forming the main photo spacer and the sub photo spacer to reduce the production cost. The height difference of the main photo spacer and the sub photo spacer can be achieved by decreasing the thickness of the first color resist layer under the sub pad part with the half exposure process. The manufacturing method is simple. In the black photo spacer array substrate of the present invention, both the main pad part and the sub pad part, which are respectively used to pad the main photo spacer and to pad the sub photo spacer, are double layer color resist structures formed with the first color resist layer and the second color resist layer; thus the main pad part and the sub pad part are convex obviously. Therefore, a thickness of the main photo spacer and a thickness of the sub photo spacer are decreased to reduce the usage amount of black photo spacer material of forming the main photo spacer and the sub photo spacer to reduce the production cost.

In order to better understand the characteristics and technical aspect of the invention, please refer to the following detailed description and accompanying drawings of the present invention. However, the drawings are provided for reference only and are not intended to be limiting of the invention.

BRIEF DESCRIPTION OF THE DRAWINGS

The technical solution and the beneficial effects of the present invention are best understood from the following detailed description with reference to the accompanying figures and embodiments.

In drawings.

DETAILED DESCRIPTION OF PREFERRED EMBODIMENTS

For better explaining the technical solution and the effect of the present invention; the present invention will be further described in detail with the accompanying drawings and the specific embodiments.

Figure 1:
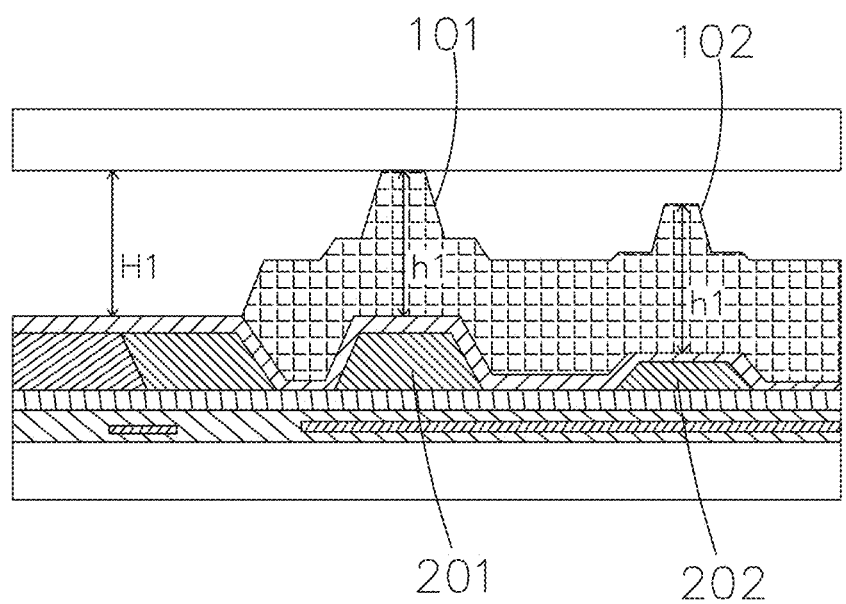
FIG. 1 is a sectional structure diagram of a conventional black photo spacer liquid crystal panel.
Figure 2:
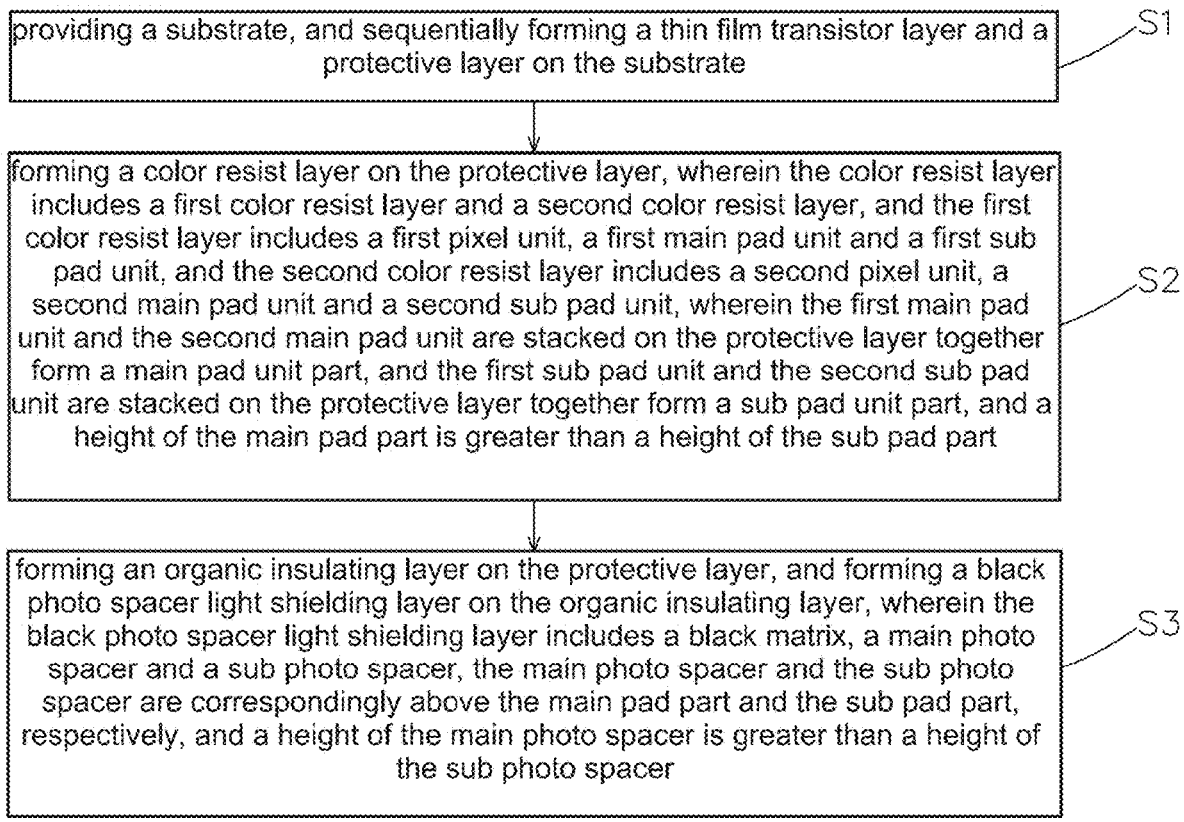
FIG. 2 is a flowchart of a manufacturing method of a black photo spacer array substrate according to the present invention.
Figure 3:
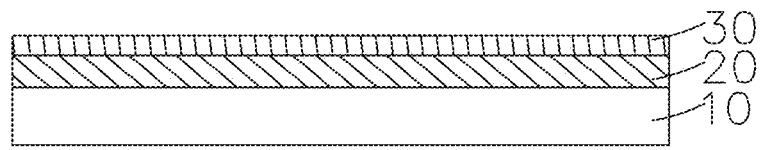
FIG. 3 is diagram of Step S1 of a manufacturing method of a black photo spacer array substrate according to the present invention.

Please refer to FIG. 2. The present invention first provides a manufacturing method of a black photo spacer array substrate, comprising:

Step S1, as shown in FIG. 3, providing a substrate 10, and forming a thin film transistor layer 20 on the substrate 10, and forming a protective layer 30 covering the thin film transistor layer 20 on the substrate 10.

Specifically, in Step S1, the thin film transistor layer 20 includes a scan line 21 and a data line 22 that is vertically crossed and insulated from the scan line 21.

Figure 4:
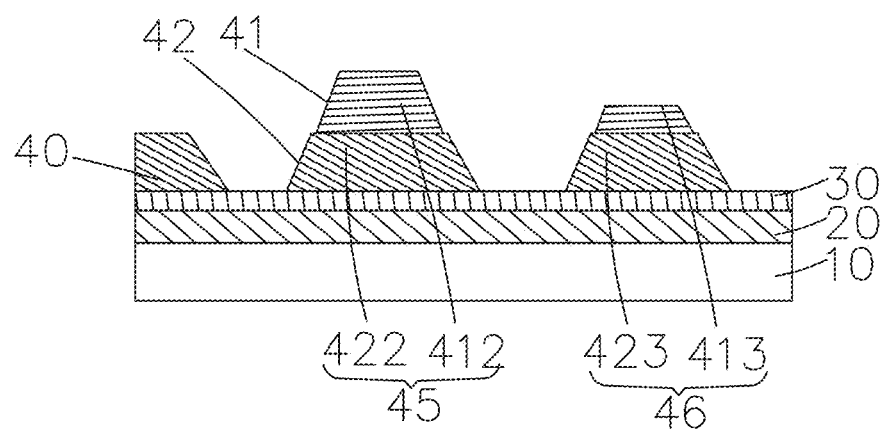
FIG. 4 is diagram of Step S2 of a manufacturing method of a black photo spacer array substrate according to the present invention.
Figure 6:
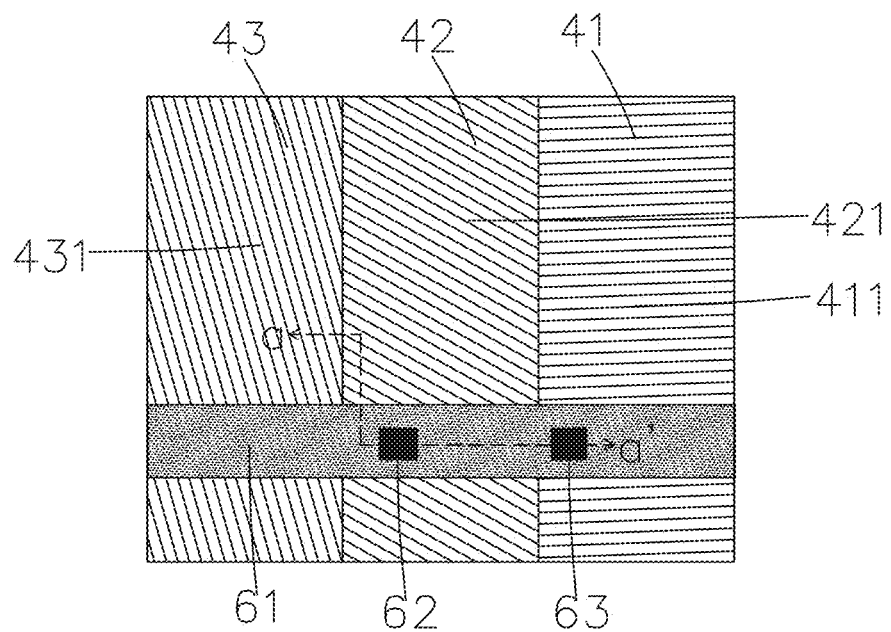
FIG. 6 is a planar structure diagram of a black photo spacer array substrate according to the present invention.

Step S2, as shown in FIG. 4 and FIG. 6, forming a color resist layer 40 on the protective layer 30, wherein the color resist layer 40 includes a first color resist layer 41, and a second color resist layer 42 and a third color resist layer 43 of different colors, and the first color resist layer 41 includes a first pixel unit 411, a first main pad unit 412 and a first sub pad unit 413, which are parallel with one another, and the second color resist layer 42 includes a second pixel unit 421, a second main pad unit 422 and a second sub pad unit 423, which are parallel with one another, wherein the first pixel unit 411 and the second pixel unit 421 are arranged side by side on the protective layer 30, and the first main pad unit 412 and the second main pad unit 422 are stacked on the protective layer 30 together form a main pad part 45, and the first sub pad unit 413 and the second sub pad unit 423 are stacked on the protective layer 30 together form a sub pad part 46, and the first color resist layer 41 is formed by a half exposure process, and the first main pad unit 412 and the first sub pad unit 413 with different thicknesses are obtained with one exposure, so that a thickness of the first sub pad unit 413 is smaller than a thickness of the first main pad unit 412, and then a height of the main pad part 45 on the substrate 10 is greater than a height of the sub pad part 46 on the substrate 10.

Specifically, the third color resist layer 43 includes a third pixel unit 431, which is arranged side by side with the first pixel unit 411 and the second pixel unit 421 on the protective layer 30.

Specifically, the first color resist layer 41, the second color resist layer 42 and the third color resist layer 43 are one of a red color resist layer, a green color resist layer and a blue color resist layer, respectively.

Specifically, in Step S2, a half tone mask (HTM) or a gray tone mask (GTM) is used to implement the half exposure process to prepare the first color resist layer 41 to obtain the first main pad unit 412 and the first sub pad unit 413 with different thicknesses with one exposure.

Specifically, in Step S2, the first color resist layer 41 is formed after the second color resist layer 42, and the first main pad unit 412 is correspondingly located on the second main pad unit 422, and the first sub pad unit 413 is correspondingly located on the second sub pad unit 423; or, the first color resist layer 41 is formed before the second color resist layer 42, and the second main pad unit 422 is correspondingly located on the first main pad unit 412, and the second sub pad unit 423 is correspondingly located on the first sub pad unit 413.

Figure 5:
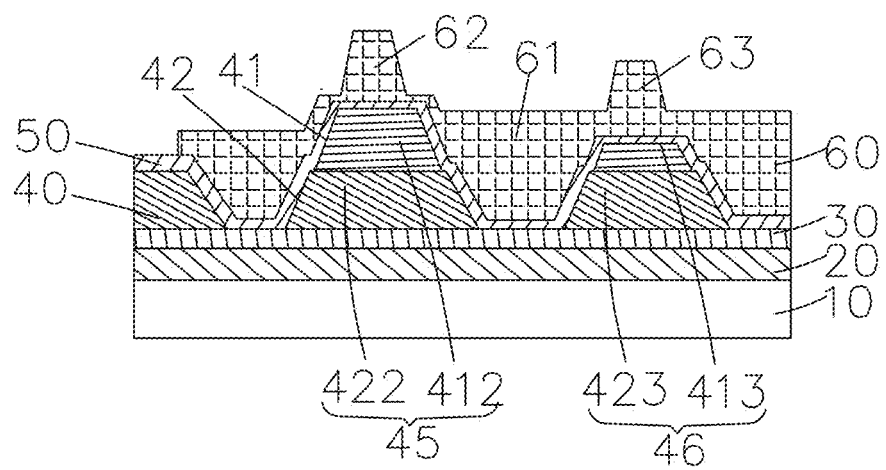
FIG. 5 is diagram of Step S3 of a manufacturing method of a black photo spacer array substrate according to the present invention.

Step S3, as shown in FIG. 5, forming an organic insulating layer 50 covering the color resist layer 40 on the protective layer 30, and coating a black photo spacer material on the organic insulating layer 50 and implementing exposure and development to the black photo spacer material to obtain a black photo spacer light shielding layer 60, wherein the black photo spacer light shielding layer 60 includes a black matrix 61, and a main photo spacer 62 and a sub photo spacer 63, which are both arranged on the black matrix 61, and the main photo spacer 62 and the sub photo spacer 63 are correspondingly above the main pad part 45 and the sub pad part 46, respectively, and a height of the main photo spacer 62 is greater than a height of the sub photo spacer 63, and the height of the sub photo spacer 63 is greater than a height of the black matrix 61.

Specifically, the black matrix 61 is correspondingly located above the scan line 21.

In Step S3, with a full tone mask, a full exposure is used to expose the black photo spacer material to obtain the black matrix 61, the main photo spacer 62 and a sub photo spacer 63. Therefore, a thickness of the main photo spacer 62 and a thickness of the sub photo spacer 63 are the same, and a thickness difference between the first main pad unit 412 and the first sub pad unit 413 constitutes a height difference between the main pad part 45 and the sub pad part 46.

In the manufacturing method of the black photo spacer array substrate provided by the present invention, a double layer color resist structure formed with the first color resist layer 41 and the second color resist layer 42 is used to pad the main pad part 45 and the sub pad part 46 of the main photo spacer 62 and the sub photo spacer 63. Then, the main pad part 45 and the sub pad part 46 are convex obviously, and the thickness of the main photo spacer 62 and the thickness of the sub photo spacer 63 are decreased to reduce the usage amount of black photo spacer material of forming the main photo spacer 62 and the sub photo spacer 63 to reduce the production cost. The height difference of the main photo spacer 62 and the sub photo spacer 63 can be achieved by decreasing the thickness of the first color resist layer 41 under the sub pad part 63 with the half exposure process. The manufacturing method is simple.

Figure 7:
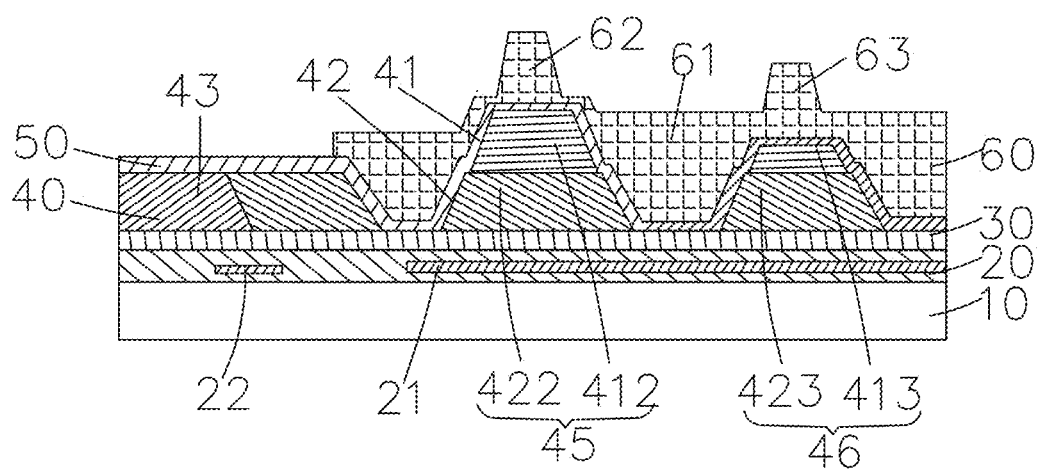
FIG. 7 is a sectional structure diagram of a black photo spacer array substrate according to the present invention along the a-a' line in FIG. 6.

Please refer to FIG. 6 and FIG. 7, On the basis of the aforesaid manufacturing method of the black photo spacer array substrate, the present invention further provides a black photo spacer array substrate, comprising a substrate 10, a thin film transistor layer 20 on the substrate 10, a protective layer 30 covering the substrate 10 and the thin film transistor layer 20, a color resist layer 40 on the protective layer 30, an organic insulating layer 50 covering the color resist layer 40 and the protective layer 30 and a black photo spacer light shielding layer 60 on the organic insulating layer 50;

wherein the black photo spacer light shielding layer 60 includes a black matrix 61, and a main photo spacer 62 and a sub photo spacer 63, which are both arranged on the black matrix 61;

the color resist layer 40 includes a first color resist layer 41 and a second color resist layer 42 of different colors, and the first color resist layer 41 includes a first pixel unit 411, a first main pad unit 412 and a first sub pad unit 413, which are parallel with one another, and the second color resist layer 42 includes a second pixel unit 421, a second main pad unit 422 and a second sub pad unit 423, which are parallel with one another, wherein the first pixel unit 411 and the second pixel unit 421 are arranged side by side on the protective layer 30, and the first main pad unit 412 and the second main pad unit 413 are stacked on the protective layer 422 together form a main pad part 45, and the first sub pad unit 413 and the second sub pad unit 423 are stacked on the protective layer 30 together form a sub pad part 46; and a thickness of the first sub pad unit 413 is smaller than a thickness of the first main pad unit 412; and then a height of the main pad part 45 is greater than a height of the sub pad part 46;

the main photo spacer 62 and the sub photo spacer 63 are correspondingly above the main pad part 45 and the sub pad part 46; respectively, and a height of the main photo spacer 62 is greater than a height of the sub photo spacer 63, and the height of the sub photo spacer 63 is greater than a height of the black matrix 61.

Specifically, a thickness difference between the first main pad unit 412 and the first sub pad unit 413 constitutes a height difference between the main pad part 45 and the sub pad part 46.

Specifically, the first main pad unit 412 is correspondingly located on the second main pad unit 422, and the first sub pad unit 413 is correspondingly located on the second sub pad unit 423; or, the second main pad unit 422 is correspondingly located on the first main pad unit 412, and the second sub pad unit 423 is correspondingly located on the first sub pad unit 413.

Specifically; the color resist layer 40 further comprises a third color resist layer 43; the third color resist layer 43 includes a third pixel unit 431, which is arranged side by side with the first pixel unit 411 and the second pixel unit 421 on the protective layer 30.

Specifically; the first color resist layer 41, the second color resist layer 42 and the third color resist layer 43 are one of a red color resist layer, a green color resist layer and a blue color resist layer, respectively.

Specifically, the thin film transistor layer 20 includes a scan line 21 and a data line 22 that is vertically crossed and insulated from the scan line 21.

Specifically, the black matrix 61 is correspondingly located above the scan line 21.

In the black photo spacer array substrate of the present invention, both the main pad part 45 and the sub pad part 46, which are respectively used to pad the main photo spacer 62 and to pad the sub photo spacer 63, are double layer color resist structures formed with the first color resist layer 41 and the second color resist layer 46, thus the main pad part 45 and the sub pad part 46 are convex obviously. Therefore, a thickness of the main photo spacer 62 and a thickness of the sub photo spacer 63 are decreased to reduce the usage amount of black photo spacer material of forming the main photo spacer 62 and the sub photo spacer 63 to reduce the production cost.

In conclusion, in the manufacturing method of the black photo spacer array substrate provided by the present invention, a double layer color resist structure formed with the first color resist layer and the second color resist layer is used to pad the main pad part and the sub pad part of the main photo spacer and the sub photo spacer. Then, the main pad part and the sub pad part are convex, and the thickness of the main photo spacer and the thickness of the sub photo spacer are decreased to reduce the usage amount of black photo spacer material of forming the main photo spacer and the sub photo spacer to reduce the production cost. The height difference of the main photo spacer and the sub photo spacer can be achieved by decreasing the thickness of the first color resist layer under the sub pad part with the half exposure process. The manufacturing method is simple. In the black photo spacer array substrate of the present invention, both the main pad part and the sub pad part, which are respectively used to pad the main photo spacer and to pad the sub photo spacer, are double layer color resist structures formed with the first color resist layer and the second color resist layer, thus the main pad part and the sub pad part are convex obviously. Therefore, a thickness of the main photo spacer and a thickness of the sub photo spacer are decreased to reduce the usage amount of black photo spacer material of forming the main photo spacer and the sub photo spacer to reduce the production cost.

Above are only specific embodiments of the present invention, the scope of the present invention is not limited to this, and to any persons who are skilled in the art, change or replacement which is easily derived should be covered by the protected scope of the invention. Thus, the protected scope of the invention should go by the subject claims.

What is claimed is:

1. A manufacturing method of a black photo spacer array substrate, comprising:

Step S1, providing a substrate, and forming a thin film transistor layer on the substrate, and forming a protective layer covering the thin film transistor layer on the substrate;

Step S2, forming a color resist layer on the protective layer, wherein the color resist layer includes a first color resist layer and a second color resist layer of different colors, and the first color resist layer includes a first pixel unit, a first main pad unit and a first sub pad unit, which are parallel with one another, and the second color resist layer includes a second pixel unit, a second main pad unit and a second sub pad unit, which are parallel with one another, wherein the first pixel unit and the second pixel unit are arranged side by side on the protective layer, and the first main pad unit and the second main pad unit are stacked on the protective layer together form a main pad part, and the first sub pad unit and the second sub pad unit are stacked on the protective layer together form a sub pad part, and the first color resist layer is formed by a half exposure process, and the first main pad unit and the first sub pad unit with different thicknesses are obtained with one exposure, so that a thickness of the first sub pad unit is smaller than a thickness of the first main pad unit, and then a height of the main pad part is greater than a height of the sub pad part;

Step S3, forming an organic insulating layer covering the color resist layer on the protective layer, and coating a black photo spacer material on the organic insulating layer and implementing exposure and development to the black photo spacer material to obtain a black photo spacer light shielding layer, wherein the black photo spacer light shielding layer includes a black matrix, and a main photo spacer and a sub photo spacer, which are both arranged on the black matrix, the main photo spacer and the sub photo spacer are correspondingly above the main pad part and the sub pad part, respectively, and a height of the main photo spacer is greater than a height of the sub photo spacer, and the height of the sub photo spacer is greater than a height of the black matrix.

2. The manufacturing method of a black photo spacer array substrate according to claim 1, wherein in Step S2, a half tone mask or a gray tone mask is used to implement the half exposure process to prepare the first color resist layer to obtain the first main pad unit and the first sub pad unit with different thicknesses with one exposure;

in Step S3, a full exposure is used to expose the black photo spacer material to obtain the black matrix, the main photo spacer and a sub photo spacer, and a thickness difference between the first main pad unit and the first sub pad unit constitutes a height difference between the main pad part and the sub pad part.

3. The manufacturing method of a black photo spacer array substrate according to claim 1, wherein in Step S2, the first main pad unit is correspondingly located on the second main pad unit, and the first sub pad unit is correspondingly located on the second sub pad unit; or, the second main pad unit is correspondingly located on the first main pad unit, and the second sub pad unit is correspondingly located on the first sub pad unit.

4. The manufacturing method of a black photo spacer array substrate according to claim 1, wherein in Step S2, the color resist layer further includes a third color resist layer;

the third color resist layer includes a third pixel unit, which is arranged side by side with the first pixel unit and the second pixel unit on the protective layer;

the first color resist layer, the second color resist layer and the third color resist layer are one of a red color resist layer, a green color resist layer and a blue color resist layer, respectively.

5. The manufacturing method of a black photo spacer array substrate according to claim 1, wherein in Step S1, the thin film transistor layer includes a scan line and a data line that is vertically crossed and insulated from the scan line;

the black matrix is correspondingly located above the scan line.

6. A black photo spacer array substrate, comprising a substrate, a thin film transistor layer on the substrate, a protective layer covering the substrate and the thin film transistor layer, a color resist layer on the protective layer, an organic insulating layer covering the color resist layer and the protective layer and a black photo spacer light shielding layer on the organic insulating layer;

wherein the black photo spacer light shielding layer includes a black matrix, and a main photo spacer and a sub photo spacer, which are both arranged on the black matrix;

the color resist layer includes a first color resist layer and a second color resist layer of different colors, and the first color resist layer includes a first pixel unit, a first main pad unit and a first sub pad unit, which are parallel with one another, and the second color resist layer includes a second pixel unit, a second main pad unit and a second sub pad unit, which are parallel with one another; wherein the first pixel unit and the second pixel unit are arranged side by side on the protective layer, and the first main pad unit and the second main pad unit are stacked on the protective layer together form a main pad part, and the first sub pad unit and the second sub pad unit are stacked on the protective layer together form a sub pad part, and a thickness of the first sub pad unit is smaller than a thickness of the first main pad unit, and then a height of the main pad part is greater than a height of the sub pad part;

the main photo spacer and the sub photo spacer are correspondingly above the main pad part and the sub pad part, respectively, and a height of the main photo spacer is greater than a height of the sub photo spacer; and the height of the sub photo spacer is greater than a height of the black matrix.

7. The black photo spacer array substrate according to claim 6, wherein a thickness difference between the first main pad unit and the first sub pad unit constitutes a height difference between the main pad part and the sub pad part.

8. The black photo spacer array substrate according to claim 6, wherein the first main pad unit is correspondingly located on the second main pad unit, and the first sub pad unit is correspondingly located on the second sub pad unit; or, the second main pad unit is correspondingly located on the first main pad unit, and the second sub pad unit is correspondingly located on the first sub pad unit.

9. The black photo spacer array substrate according to claim 6, wherein the color resist layer further includes a third color resist layer;

the third color resist layer includes a third pixel unit, which is arranged side by side with the first pixel unit and the second pixel unit on the protective layer;

the first color resist layer, the second color resist layer and the third color resist layer are one of a red color resist layer, a green color resist layer and a blue color resist layer, respectively.

10. The black photo spacer array substrate according to claim 6, wherein the thin film transistor layer includes a scan line and a data line that is vertically crossed and insulated from the scan line;

the black matrix is correspondingly located above the scan line.

* * * * *